(12) United States Patent
Hogan

(10) Patent No.: US 6,614,697 B2
(45) Date of Patent: Sep. 2, 2003

(54) DIODE-BASED MULTIPLEXER

(75) Inventor: Josh N. Hogan, Los Altos, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/976,744

(22) Filed: Oct. 13, 2001

(65) Prior Publication Data

US 2003/0072184 A1 Apr. 17, 2003

(51) Int. Cl.[7] .................................................. G11C 7/00
(52) U.S. Cl. .............................. 365/189.02; 365/230.02
(58) Field of Search ........................... 365/189.02, 226, 365/230.02, 243, 105, 115, 233

(56) References Cited

U.S. PATENT DOCUMENTS

| | | | |
|---|---|---|---|
| 5,856,666 A | * | 1/1999 | Moulsley ..................... 348/308 |
| 5,900,767 A | | 5/1999 | Bird et al. |
| 6,078,358 A | * | 6/2000 | Bird ............................ 348/308 |
| 6,199,140 B1 | * | 3/2001 | Srinivasan et al. ........... 365/49 |
| 2001/0030569 A1 | * | 10/2001 | Bird ............................ 327/407 |

OTHER PUBLICATIONS

Barabas U et al: Diode Multiplexer in the multi–GBIT/S range electronics letters, IEE Stevenage, BG vol. 14, No. 3, Feb. 1978 (Feb. 1978), pp. 62–64, XP000797796; ISSN: 0013–5194.

* cited by examiner

Primary Examiner—Thong Le

(57) ABSTRACT

A multiplexer includes a plurality of stages. Each stage includes a storage device coupled to a data output; a first diode coupled between a data input and a power supply input; and a second diode coupled between the power supply input and the data output.

23 Claims, 5 Drawing Sheets

DIODE-BASED MULTIPLEXER

BACKGROUND

The present invention relates to multiplexers. The present invention also relates to one-time programmable (OTP) solid state memory.

Portable devices such as PDAs, handheld computers, digital cameras and digital music players include memory for storing data, digital images and MP3 files. Different types of memory are available for these portable devices. Conventional memory types include flash memory, mini-hard drives, mini-compact discs, and magnetic tape. However, each of these memory types has one or more of the following limitations: large physical size, low storage capacity, relatively high cost, poor robustness, slow access time and high power consumption.

Solid state diode-based OTP memory is disclosed in assignee's U.S. Ser. No. 09/875,356 filed Jun. 5, 2001. Compared to the conventional memory, the diode-based memory has a high shock tolerance, low power consumption, fast access time, moderate transfer rate and good storage capacity. The diode-based memory can fit into a standard portable interface (e.g., PCMCIA, CF) of a portable device.

Solid state diode-based OTP memory devices can include large numbers of data and address lines. Multiplexers may be used to reduce the number of data and address lines to a device.

The multiplexers may be based on transistor logic such as TTL. However, manufacturing the layers required for transistors in a diode-based OTP device would increase the cost and complexity of the device.

It would be desirable to avoid the use of transistors in multiplexers of diode-based OTP memory devices.

SUMMARY

According to one aspect of the present invention, a multiplexer includes a plurality of stages. Each stage includes a storage device coupled to a data output; a first diode coupled between a data input and a power supply input; and a second diode coupled between the power supply input and the data output.

Other aspects and advantages of the present invention will become apparent from the following detailed description, taken in conjunction with the accompanying drawings, illustrating by way of example the principles of the present invention.

DETAILED DESCRIPTION

Figure 1:
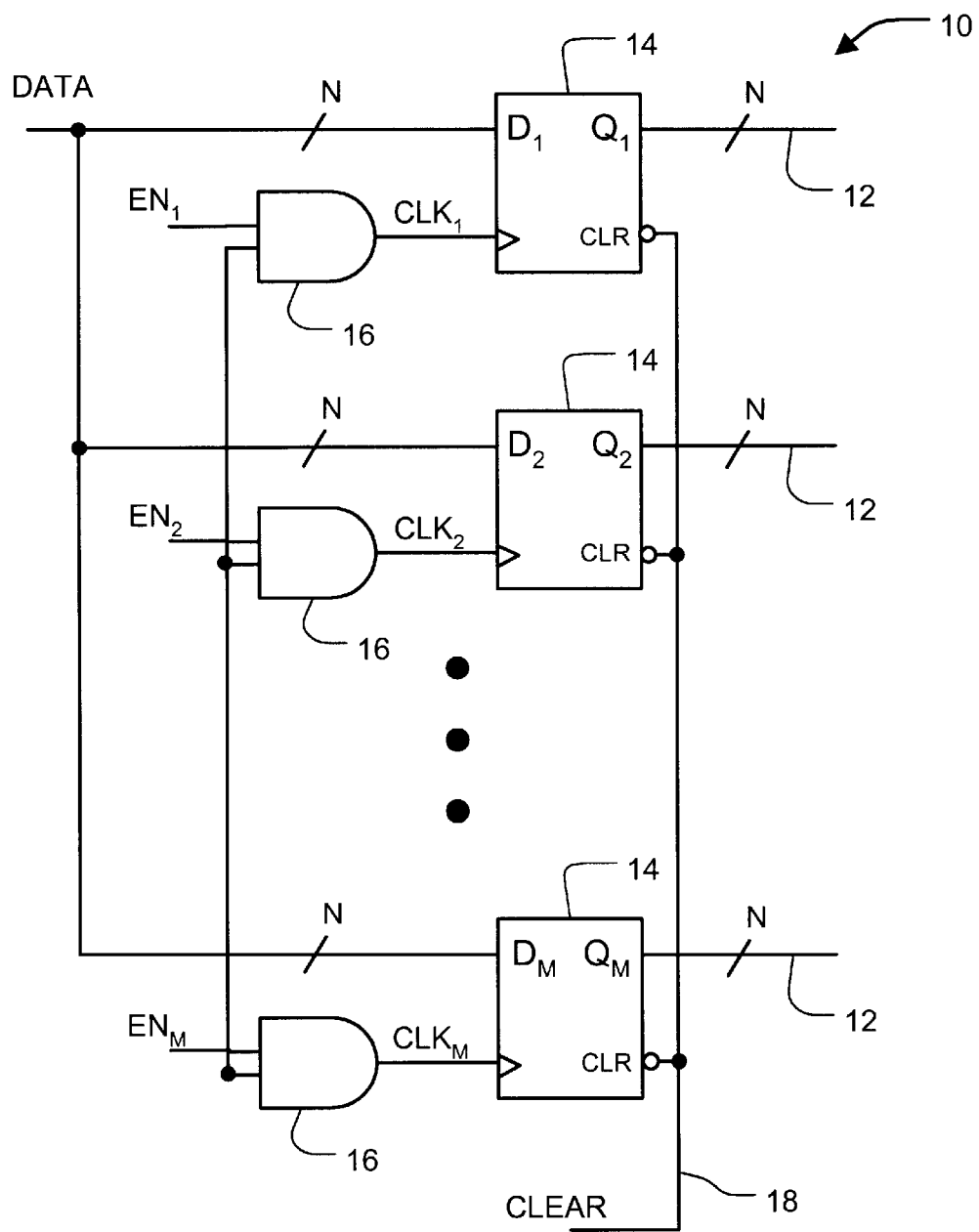
FIG. 1 is an illustration of a multiplexer according to the present invention.

Referring to FIG. 1, a multiplexer 10 includes M diode-based latches 14, where integer M>1. Inputs ($D_1$ to $D_M$) of the latches 14 are connected in parallel so that each latch 14 receives the same N-bit word (DATA). Each latch 14 has an output line 12 that is N-bits wide, where integer N>1. The multiplexer 10 can receive an N-bit word (DATA) and forward that N-bit word (DATA) to any one of M output lines 12.

Clock signals ($CLK_1$, $CLK_2$, ..., $CLK_M$) are supplied to the clock inputs of the latches 14. For instance, the clock signal $CLK_1$ is supplied to the first latch 14. When the clock signal $CLK_1$ is high, the first latch 14 stores the data word (DATA). When the clock signal $CLK_1$ goes low, the stored data is made available on the output line 12 of the first latch 14.

A reference clock (CLK) and enable signals ($EN_1$, $EN_2$, ..., $EN_M$) are generated by a signal generator (not shown in FIG. 1). Each enable signal ($EN_1$, $EN_2$, ..., $EN_M$) corresponds to a latch 14. The multiplexer 10 further includes gates 16 for generating the clock signals ($CLK_1$, $CLK_2$, ..., $CLK_M$) from the reference clock (CLK) and the enable signals ($EN_1$, $EN_2$, ..., $EN_M$). For instance, when the reference clock (CLK) and the first enable signal ($EN_1$) are high, the first latch 14 stores the data word (DATA). The gates 16 may be based on ECL technology or another technology that does not use transistors.

The multiplexer 10 also includes a line 18 for clearing data stored in the latches 14. A clear data signal (CLEAR) is generated by the signal generator and supplied to the clear data line 18.

The multiplexer shown in FIG. 1 provides about an M:1 reduction in input lines. Thus a multiplexer having M=32 latches provides an almost 32:1 reduction in input lines.

Figure 2:
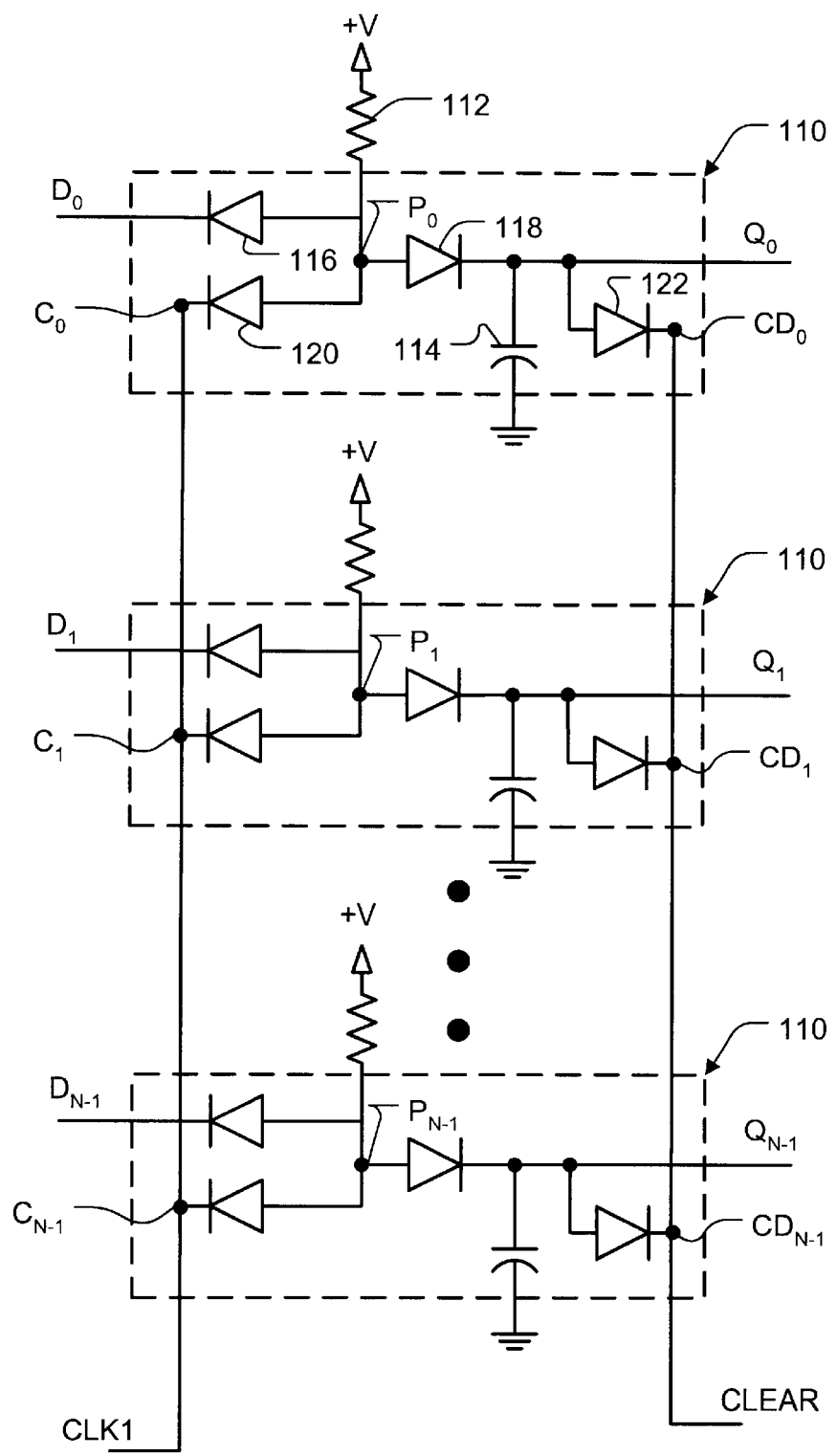
FIG. 2 is an illustration of a latch for the multiplexer.

FIG. 2 shows a diode-based latch 14 in greater detail. The latch 14 includes N stages 110, each stage 110 having a data input ($D_n$), a power supply input ($P_n$), and a data output ($Q_n$), where $0 \leq n \leq (N-1)$. The data input ($D_0$) of the first stage 110 receives the first bit of the data word (DATA), the data input ($D_1$) of the second stage receives the $2^{nd}$ bit of the data word (DATA), and the data input ($D_{N-1}$) of the $N^{th}$ stage receives the $N^{th}$ bit of the data word (DATA). The N data outputs ($Q_0$ to $Q_{N-1}$) of the N stages 110 are connected to an N-bit data line 12. For each stage 110, a pull-up resistor 112 is connected between the power supply input ($P_n$) and a voltage source (+V).

Each stage 110 includes a charge storage device (e.g., a capacitor) 114 coupled to the data output ($Q_n$); a first diode 116 coupled between the data input ($D_n$) and the power supply input ($P_n$); and a second diode 118 coupled between the power supply input ($P_n$) and the data output ($Q_n$). The cathode of the first diode 116 is connected to the data input ($D_n$), and the anode of the first diode 116 is connected to the power supply input ($P_n$). The cathode of the second diode 118 is connected to the data output ($Q_n$), and the anode of the second diode 118 is connected to the power supply input ($P_n$).

Each stage 110 further has a clock input ($C_n$) and a third diode 120 connected between the clock input ($C_n$) and the power supply input ($P_n$). The clock inputs ($C_0$ to $C_{N-1}$) of the stages 110 are tied together to receive the same clock signal (e.g., $CLK_1$).

Each stage 110 also has a clear data input ($CD_n$) and a fourth diode 122 connected between the clear data input ($CD_n$) and the data output (Qn). The clear data inputs ($CD_0$ to $CD_{N-1}$) of the stages 110 are tied together to receive the same clear data signal (CLEAR).

Figure 3:
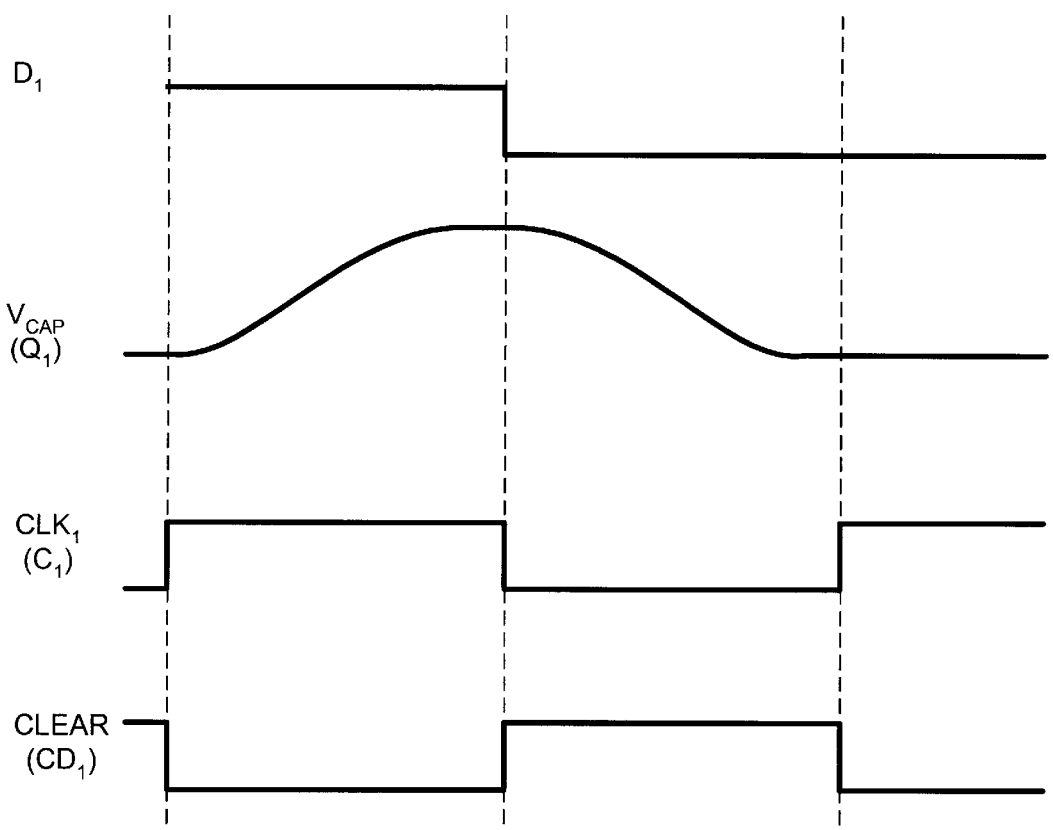
FIG. 3 is a timing diagram for the multiplexer.

Additional reference is made to FIG. 3. Operation of the second stage 110 will now be described by the following example. Initial conditions are as follows. The clock signal is de-asserted and the clear signal is asserted. The third and fourth diodes 120 and 122 are forward-biased, as current flows from the power supply through the third diode 120, and the capacitor 114 is discharged through the fourth diode 122.

At the beginning of the operation, the clock signal ($CLK_1$) is asserted and the clear data signal (CLEAR) is de-asserted. The third and fourth diodes 120 and 122 become reverse biased. If the data word bit ($D_1$) is high, the first diode 116 becomes reverse biased and the second diode 118 becomes forward biased. Current flows through the pull-up resistor 112 and the second diode 118, and charges the capacitor 114. Capacitor voltage ($V_{CAP}$) rises.

Data is read out at the trailing edge of the clock signal ($CLK_1$). A high capacitor voltage ($V_{CAP}$) is read at the data output ($Q_1$). This high voltage corresponds to the high data state.

After data has been read out, the clear data signal (CLEAR) is re-asserted. Consequently, the third and fourth diodes 120 and 122 become forward biased, whereby current flows from the power supply through the third diode 120, and the capacitor 114 is discharged through the fourth diode 122. Capacitor voltage ($V_{CAP}$) falls.

At the beginning of the next clock cycle, the clock signal ($CLK_1$) is asserted and the clear data signal (CLEAR) is de-asserted. The third and fourth diodes 120 and 122 become reverse biased. If the data word bit ($D_1$) is low, the first diode 116 becomes forward biased. Current flows through the first diode 116, and the capacitor 114 is not charged. Therefore, capacitor voltage (Vcap) does not rise.

Data is read out at the trailing edge of the clock signal ($CLK_1$). A low capacitor voltage (Vcap) at the data output ($Q_1$) corresponds to the low data state.

Figure 4:
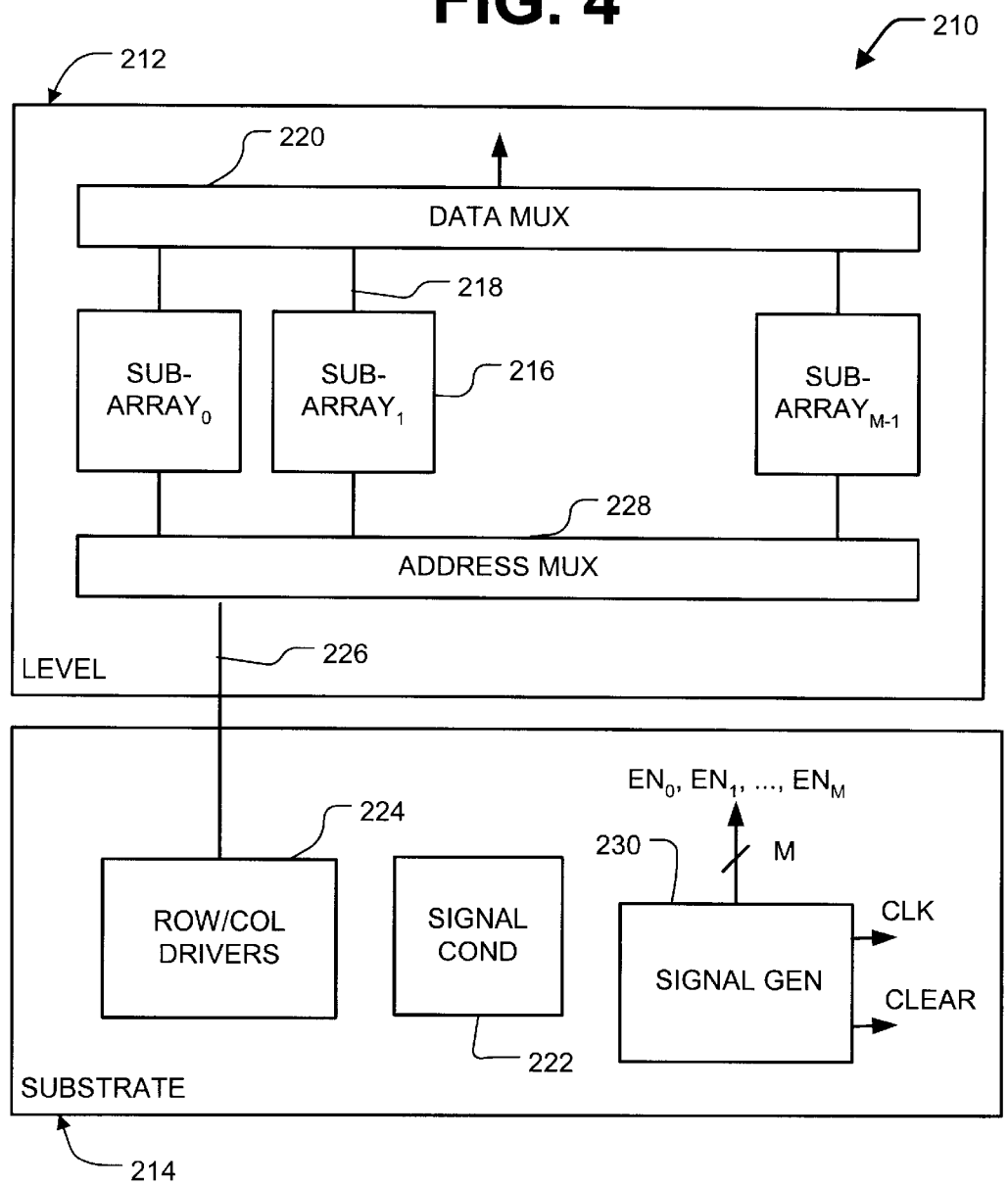
FIG. 4 is an illustration of a diode-based memory device including sub-arrays and multiplexers according to the present invention.

FIG. 4 shows a diode-based OTP memory device 210. One or more memory levels 212 are stacked on a silicon substrate 214. Each level 212 includes M sub-arrays 216. Each sub-array 216 is described in greater detail below. Data is read out from sub-arrays 216 on data lines 218. The data lines 218 are supplied to a data multiplexer 220 (which may have the same construction as the multiplexer 10 shown in FIG. 1). An output of the data multiplexer 220 is supplied to a signal conditioning circuit 222 on the substrate 214.

Addresses are decoded by row and column drivers 224, and the decoded addresses are multiplexed to the appropriate address lines 226 by an address multiplexer 228 (which may have the same construction as the multiplexer 10 shown in FIG. 1). The row and column driver 224 are also on the substrate 214

The enable signals ($EN_1, EN_2, \ldots, EN_M$), the reference clock (CLK) and the clear data signal (CLEAR) are generated by a signal generator 230 on the substrate 214. These timing signals may be generated by decoding the addresses.

Figure 5:
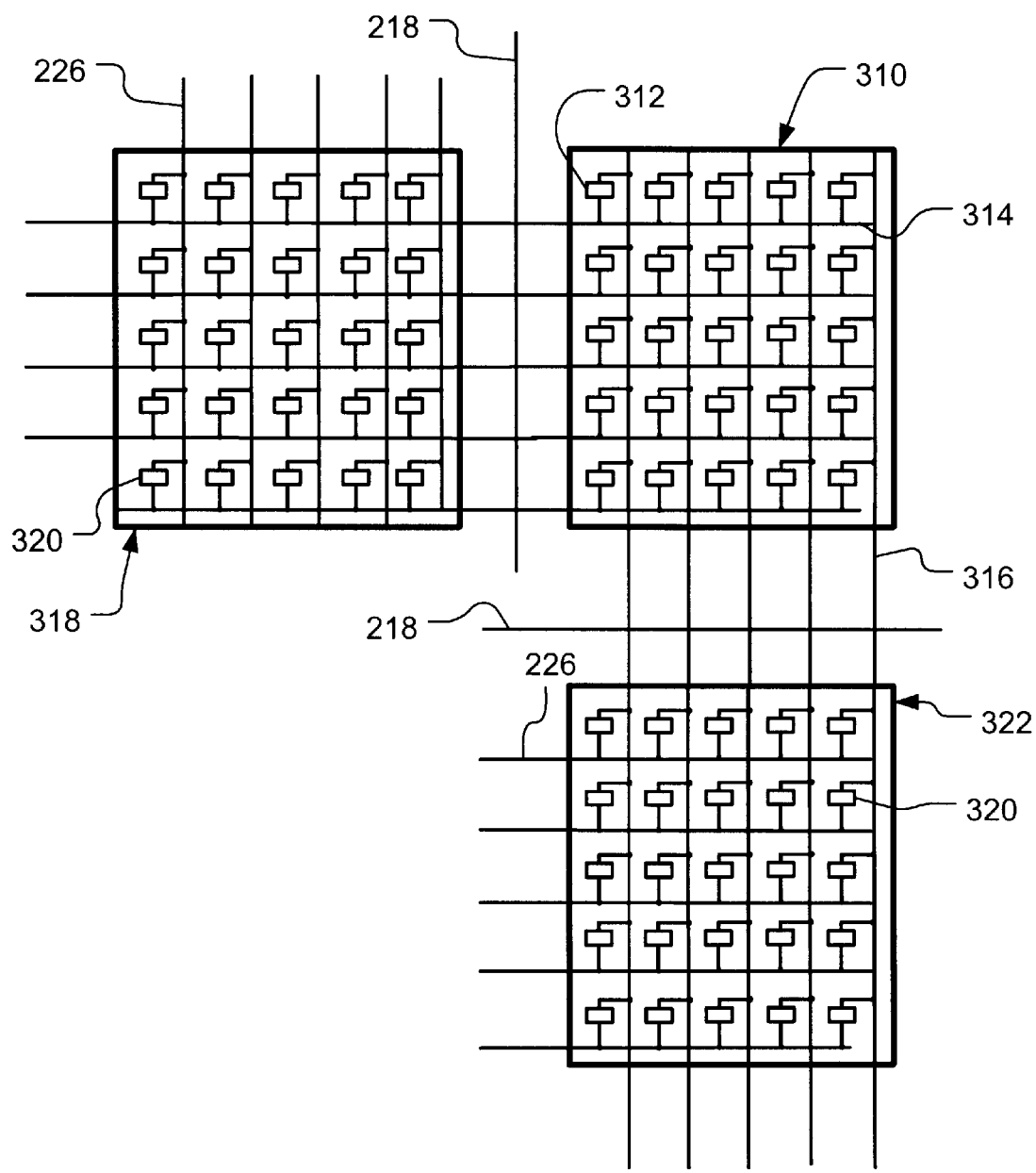
FIG. 5 is an illustration of a sub-array.

Reference is now made to FIG. 5. A sub-array 216 includes a cross point resistive array 310 of OTP memory elements 312, word lines 314 extending along rows of the memory elements 312, and bit lines 316 extending along columns of the memory elements 312. There may be one word line 314 for each row of the memory elements 312 and one bit line 316 for each column of memory elements 312. Each memory element 312 is located at a cross point of a word line 314 and a bit line 316.

An OTP row decoder 318 selects the word lines 314 by decoding addresses supplied to row address lines 226 by the address multiplexer 228. The row decoder 318 includes a plurality of OTP address elements 320. Each address element 320 of the row decoder 318 is at a cross point of a word line 314 and a row address line 226.

An OTP column decoder 322 selects the column lines 316 by decoding addresses supplied to column address lines 226 by the address multiplexer 228. The column decoder 322 includes a plurality of OTP address elements 320. Each address element 320 of the column decoder 322 is at a cross point of a bit line 316 and a column address line 226.

The memory elements 312 and the address elements 320 both include diodes.

Data may be written to the device 210 by supplying an address to the row/column drivers 224 and the signal generator 230. The signal generator 230 decodes the address and causes the address multiplexer 228 to select a sub-array. The row/column drivers 224 decode the address and send the decoded address to the address multiplexer 228 and, therefore, to the selected sub-array. The address logic of the selected sub-array receives the decoded address (via the address lines 226) and selects word and bit lines 314 and 316. A write current flows through the selected word and bit lines 314 and 316 and, therefore, flows through a memory element 312 at the cross point of the selected word and bit lines 314 and 316. Magnitude of the write current is sufficient to change the resistance state of the selected memory element 312.

The resistance state of a memory element 312 may be sensed by supplying an address to the row/column drivers 224. The address multiplexer 228 sends a decoded address to a selected a sub-array. In response to the decoded address, word and bit lines 314 and 316 are selected. A sense current flows through the selected word and bit lines 314 and 316 and, therefore, flows through a memory element 312 at the cross point of the selected word and bit lines 314 and 316. Magnitude of the sense current indicates the resistance state of the selected memory element 216. The sense current is converted to a digital value, and the data multiplexer sends the digital value to the signal conditioning circuit 222 on the substrate 214. All data out from a sub-array is effectively wired together, however, only the memory bit which corresponds to the selected address is enabled.

The present invention is not limited to the specific embodiments described and illustrated above. Instead, the present invention is construed according to the claims that follow.

What is claimed is:

1. A latch for a multiplexer adapted to receive an N-bit word, the latch comprising N stages, each stage having a data input for receiving a bit of the N-it word, a power supply input and a data output, each stage including:

a storage device coupled to the data output;

a first diode coupled between the data input and the power supply input: and a second diode coupled between the power supply input and the data output;

each stage storing the bit on its data input in its storage device when the latch is enabled, and outputting the stored bit on its output line.

2. The multiplexer of claim 1, wherein a cathode of the first diode is connected to the data input, and an anode of the first diode is connected to the power supply input; and wherein a cathode of the second diode is connected to the data output, and an anode of the second diode is connected to the power supply input.

3. The multiplexer of claim 1, wherein the storage device is a charge storage device.

4. A multiplexer adapted to receive an N-bit word, the multiplexer comprising M latches, each latch having N stages, where integer M>1 and integer N>1, each stage having a data input for receiving a bit of the N-bit word, a power supply input, and a data output, each stage including a charge storage device coupled to the data output, a first diode coupled between the data Input and the power supply input, and a second diode coupled between the power supply input and the data output; each latch that is enabled storing the N-bit word.

5. The multiplexer of claim 4, wherein each latch has an N-bit wide input formed by the data inputs of its N stages, and wherein each latch has an N-bit wide output line formed by the data outputs of its N stages.

6. The multiplexer of claim 4, further comprising logic for enabling at least one of the latches at a time.

7. A multiplexer adapted to receive an N-bit word, the multiplexer comprising M latches, each latch having N stages, where Integer M>1 and integer N>1, each stage having a data input, a power supply input, a clock input, and a data output, each stage Including a charge storage device coupled to the data output, a first diode coupled between the data input and the power supply input, a second diode coupled between the power supply input and the data output, and a third diode connected between the clock input and the power supply input, wherein the clock inputs of the stages are tied together.

8. A multiplexer adapted to receive an N-bit word, the multiplexer comprising M latches, each latch having N stages, where integer M>1 and integer N>1, each stage having a data input, a power supply input, a clear data input, and a data output, each stage including a charge storage device coupled to the data output, a first diode coupled between the data input and the power supply input, a second diode coupled between the power supply input and the data output, and a third diode connected between the clear data input and the data output, wherein the clear data inputs of the stages are tied together.

9. The multiplexer of claim 4, wherein input data determines whether the first diode is forward biased or reverse biased; whereby the latch is set to a first logic state if the first diode is forward biased, and whereby the latch is set to a second logic state if the first diode is reverse biased.

10. A solid state memory device comprising:
diode-based main memory;
diode-based address logic for the main memory; and
a multiplexer for one of the main memory and the address logic, the multiplexer including a plurality of latches, each latch having N stages, where integer N>1, each stage having a data input, a power supply input, and a data output, each stage including a charge storage device coupled to the data output, a first diode coupled between the data input and the power supply input, and a second diode coupled between the power supply input and the data output:
each latch, when enabled, storing an N-bit word provided on its N inputs.

11. The device of claim 10, further comprising address lines for the address logic, the address lines coupled to the data outputs of the stages.

12. The device of claim 11, wherein each latch has an N-bit output, wherein the address logic is divided Into groups, and wherein different N-bit outputs correspond to different groups.

13. The device of claim 10, further comprising data lines for the main memory, the data lines coupled to the data outputs of the stages.

14. The device of claim 13, wherein each latch has an N-bit output, wherein the main memory is divided into groups, and wherein different N-bit outputs correspond to different groups.

15. The device of claim lop further comprising:
a substrate upon which the main memory and address logic are formed, the substrate including logic for generating timing signals for the latches; and
gates, responsive to the timing signals, for enabling the latches, the gates also formed on the substrate.

16. The device of claim 10, each stage further having a clock input, and a third diode connected between the clock input and the power supply input, wherein the clock inputs of the stages are tied together.

17. A solid state memory device comprising:
diode-based main memory;
diode-based address logic for the main memory; and
a multiplexer for one of the main memory and the address logic, the multiplexer including a plurality of latches, each latch having N stages, where integer N>1, each stage having a data input, a power supply input, a clear data input, and a data output, each stage Including a charge storage device coupled to the data output, a first diode coupled between the data input and the power supply input, a second diode coupled between the power supply input and the data output, and a third diode connected between the clear data input and the data output, wherein the clear data inputs of the stages are tied together.

18. A solid state memory device comprising:
diode-based main memory;
diode-based address logic for the main memory; and
a first multiplexer for one of the main memory and the address logic, the first multiplexer including a plurality of latches, each latch having N stages, where integer N>1, each stage having a data input, a power supply input, and a data output, each stage including a charge storage device coupled to the data output, a first diode coupled between the data input and the power supply input, and a second diode coupled between the power supply input and the data output; and
a second multiplexer for the other one of the main memory and the address logic.

19. The multiplexer of claim 4, wherein each charge storage device of an enabled latch stores a bit of the N-bit word.

20. The device of claim 10, wherein each charge storage device of an enabled latch stores a bit of the N-bit word.

21. The multiplexer of claim 1, wherein each stage has a clock input and further includes a third diode connected between the clock input and the power supply input.

22. The multiplexer of claim 1, wherein each stage has a clear data input and further Includes a third diode connected between the clear data input and the data output.

23. The multiplexer of claim 1, wherein the storage device is connected between the data output and a reference potential.

* * * * *